United States Patent [19]

Kono et al.

[11] B 3,993,869

[45] Nov. 23, 1976

[54] AMPLIFYING CIRCUIT FOR USE WITH A HIGH IMPEDANCE SOURCE TRANSDUCER

[75] Inventors: Osamu Kono, Tokyo; Takeshi Matsudaira, Kawasaki; Makoto Ishikawa, Tokyo, all of Japan

[73] Assignee: Sony Corporation, Tokyo, Japan

[22] Filed: Oct. 10, 1974

[21] Appl. No.: 513,756

[44] Published under the second Trial Voluntary Protest Program on February 3, 1976 as document No. B 513,756.

Related U.S. Application Data

[62] Division of Ser. No. 336,819, Feb. 28, 1973, Pat. No. 3,862,367.

[30] Foreign Application Priority Data

Mar. 2, 1972 Japan.............................. 47-21876
Aug. 15, 1972 Japan.............................. 47-81569

[52] U.S. Cl.................................... 179/1 A; 330/13
[51] Int. Cl.² ........................................... H04R 3/00
[58] Field of Search ................. 179/1 A; 330/13, 17, 330/35

[56] References Cited

UNITED STATES PATENTS

3,300,585  1/1967  Reedyk et al.......................... 330/35
3,378,783  4/1968  Gibson................................. 330/35

OTHER PUBLICATIONS

Gosling, "Field Effect Transistors", Wiley 1965.

N. S. (National Semiconductor), "N.S. Application Note AN 48–1", 1971.

Freiman, "Eliminate Dead Zone . . . ", Electronic Design, Sept. 26, 1968, p. 70.

Sevin, "FET," McGraw Hill, 1965, pp. 64–69.

*Primary Examiner*—Kathleen H. Claffy
*Assistant Examiner*—E. S. Kemeny
*Attorney, Agent, or Firm*—Lewis H. Eslinger; Alvin Sinderbrand

[57] ABSTRACT

An amplifying circuit for use with a transducer includes a pair of field-effect transistors which are of different conductive types from each other and each of which has gate, drain and source electrodes. The gate electrodes of the field-effect transistors are connected to each other and are further connected to an output terminal of an electrostatic type mechanical-electrical transducer, while the source electrodes of the field-effect transistors are connected to each other and are further connected to an output circuit. One of the drain electrodes is connected to a voltage source and the other drain electrode is connected to the circuit ground. High input impedance is maintained by using no gate resistor at the input, and using a current-sourced source-follower secondstage. Source resistors improve linear performance.

8 Claims, 10 Drawing Figures

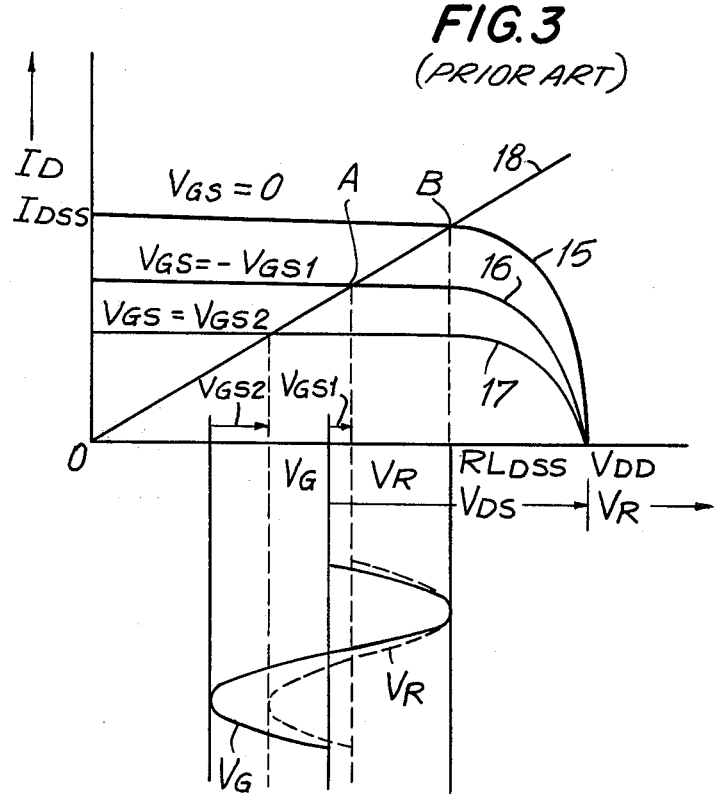

AMPLIFYING CIRCUIT FOR USE WITH A HIGH IMPEDANCE SOURCE TRANSDUCER

This is a division of application Ser. No. 336,819, filed Feb. 28, 1973, now U.S. Pat. No. 3,862,367, issued Jan. 21, 1975.

BACKGROUND OF THE INVENTION

1. Field of the Invention

The invention relates to an amplifying circuit for use with a transducer. The present circuit is also particularly useful for amplification of a signal from a high impedance source.

2. Description of the Prior Art

The use of field-effect transistors for amplification in low frequency circuits has been well accepted since such transistors have a long life, a high degree of reliability and they are generally readily available commercially. Therefore, such field-effect transistors are utilized with electrostatic type transducers for preamplifiers. The usual circuit configuration for this type of preamplifier is shown in FIG. 1.

Referring now to FIG. 1 which is a circuit diagram of a typical prior art circuit for use with an electrostatic type microphone, a field-effect transistor 10, which is an N-channel junction type field-effect transistor in this example, is connected at its drain electrode to a DC power source $+V_{DD}$ and at its source electrode to the circuit ground through a series circuit of resistors $R_1$ and $R_2$. A gate biasing resistor $R_G$ is connected between a connecting mid-point of the resistors $R_1$ and $R_2$ and the gate electrode. An electrostatic type mechanical-electrical transducer 12 having electrostatic capacity of, for example, about 10 to 100 PF is connected between the gate electrode, that is, an input terminal $t_{1a}$ and a ground terminal $t_{1b}$. A matching transformer 13 is provided in such a manner that its primary winding 13a is connected by one lead to the source electrode of the transistor 10 through a blocking capacitor 14 and by its other lead to the circuit ground. Its secondary winding 13b is connected by its leads to separate output terminals $t_{2a}$ and $t_{2b}$. Reference numeral $t_{2c}$ designates another output terminal which is grounded. Such a circuit is called a source follower type amplifier.

It is desirable that the resistance value of the gate biasing resistor $R_G$ of such a preamplifier be relatively large to increase the input impedance of the preamplifier to more than 500 meg-ohms, for example, and to decrease the effect of noise generated from the resistor $R_G$. In fact, the larger the value of this resistor $R_G$ is, the better the tone becomes.

This might suggest that the resistance of this resistor $R_G$ should be made infinity, that is, that the resistor $R_G$ should not be used. While this idea will satisfy the above described requirement, the DC operating point of the gate becomes unstable and the dynamic range of the preamplifier becomes limited.

The above problems will be further described with reference to FIGS. 2 and 3. FIG. 2 is a circuit diagram for use in explaining an amplifier having a source follower type field-effect transistor, in which reference character $R_3$ indicates a source resistor corresponding to the resistors $R_1$ and $R_2$ of FIG. 1 which are connected in series. Reference character $V_{DD}$ expresses the power source voltage, $V_{DS}$ the voltage between the drain and source, $V_R$ the voltage across the source resistor $R_3$ (output voltage), $V_{GS}$ the voltage between the gate and the source, $V_G$ the gate DC voltage and $I_D$ the drain current, respectively.

FIG. 3 is a diagram showing the $V_R - I_D$ operating characteristic curves of the source follower type field-effect transistor amplifier of FIG. 2 when $V_{GS}$ is taken as parameter. Reference numerals 15, 16 and 17 indicate $V_R - I_D$ curves at the conditions $V_{GS} = 0$, $V_{GS} = -V_{GS1}$ ($V_{GS1} / 0$) and $V_{GS} = -V_{GS2}$ ($V_{GS2} > V_{GS1} > 0$), respectively. Reference numeral 18 identifies a load line ($I_D = V_R/R_3$).

In FIG. 3, for example, a point A shows the operating point in the case when the condition $V_{GS} = -V_{GS1}$ is satisfied, and hence the output voltage $V_R$ is made equal to $V_G-(-V_{GS1})$ and becomes different from the gate DC voltage $V_G$ by the absolute value of $V_{GS1}$. Generally, in a junction type field-effect transistor, if the gate and source are biased therebetween in a forward direction, the input impedance is rapidly lowered and as a result, in order to increase the input impedance, the gate and source must be biased therebetween in a reverse direction. Accordingly, the operating point must be selected on the load line 18 between the origin O and an intersection B ($V_R = RI_{DSS}$ and $I_D = I_{DSS}$) of the curve 15 and the load line 18. It will be noticed from the above description that the upper limit of the output voltage $V_R$ is the voltage $RI_{DSS}$ and when its dynamic range is required to be wide, it is necessary to increase the voltage $RI_{DSS}$ approaching the power source voltage $V_{DD}$ as much as possible. The operating range of the output voltage $V_R$ is from zero to $RI_{DSS}$ as described above and an input signal applied to the field-effect transistor 10, which is equivalent to an output of an electrostatic type mechanical-electrical transducer, has such amplitude that the positive and negative parts thereof are substantially equal to each other with respect to the operating point. Therefore, if the operating point is selected so that the condition $V_R = RI_{DSS}/2$ is satisfied, the dynamic range is made the largest.

Consequently, in the prior art source follower type field-effect transistor amplifier, if the dynamic range is designed to be wide as much as possible, a gate biasing resistor for reversely biasing the gate of the field-effect transistor 10 with respect to the source thereof may be required.

On the other hand, the gate biasing resistor will cause tone deterioration due to the noise generated therein and a lowering of the input impedance. Further, the difference of $V_{GS}$ taken between the input and output voltages and the voltage $V_{GS}$ taken between the gate and the source changes substantially with a square characteristic according to the drain current $I_D$. As a result, the voltage $V_{GS}$ is increased when the current $I_D$ is small while the former is decreased when the latter is large under the reversely biased condition. Accordingly, as shown in FIG. 3, the output voltage $V_R$ is compressed in waveform at the region where the voltage $V_G$ is low with the result that the distortion becomes large.

The above description was made with respect to a junction type field-effect transistor. However, even in the case of a MOS type field-effect transistor, a gate biasing resistor is required for wide dynamic range.

SUMMARY OF THE INVENTION

The above and other disadvantages are overcome by the present invention of an amplifying circuit for use with a transducer comprising a pair of field-effect transistors which are of different conductive types from each other and each of which has gate, drain and source electrodes. The gate electrodes of the field-effect transistors are interconnected and are further connected to one output of a grounded signal source, while the source electrodes thereof are interconnected and are further connected to one lead of a grounded output circuit. The drain electrode of one of the field-effect transistors is connected to a power source and the drain of the other field-effect transistor is grounded.

Accordingly, it is an object of this invention to provide an amplifying circuit for use with a transducer which is free from the above mentioned drawbacks.

It is another object of this invention to provide an amplifying circuit for use with a transducer having high input impedance and an enhanced signal to noise ratio by forming the circuit without a gate biasing resistor between the gate and source electrodes of a field-effect transistor.

It is a further object of this invention to provide an amplifying circuit for use with a transducer having wide dynamic range by complementarily connecting a pair of field-effect transistors which are of different conductive types from each other.

It is a still further object of this invention to provide a wide dynamic range amplifying circuit for use with a transducer by connecting a second pair of field-effect transistors of different conductive types from each other to the output terminal of a first pair of field-effect transistors of different conductive types from each other or alternatively by connecting thereto an active element having a constant current source as its load.

The foregoing and other objectives, features, and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a circuit diagram showing a typical prior art amplifying circuit for use with an electrostatic type microphone, FIG. 2 is a DC equivalent circuit used for explaining the circuit shown in FIG. 1, FIG. 3 is the characteristic curve used for explaining the circuit shown in FIG. 1.

DESCRIPTION OF CERTAIN PREFERRED EMBODIMENTS

Figures 4, 5:
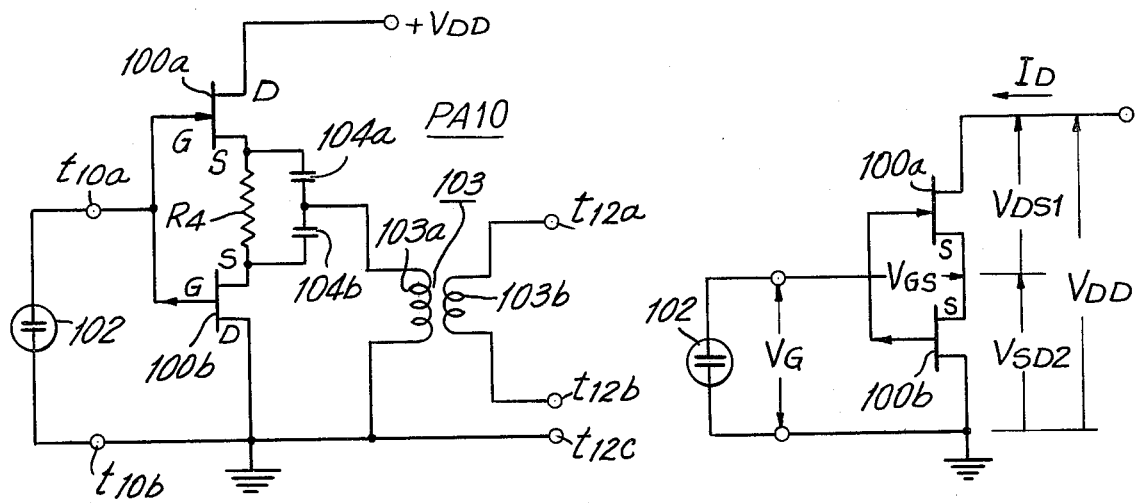
FIG. 4 is a circuit diagram showing an example of an amplifying circuit for use with a transducer according to the invention.
FIG. 5 is a DC equivalent circuit used for explaining the circuit shown in FIG. 4.

Referring now to FIG. 4, a preamplifying circuit which is one of the specific embodiments of the herein-disclosed invention is illustrated. Reference character PA10 designates the preamplifier as a whole. Reference numerals 100a and 100b refer to first and second field-effect transistors which are of different conductive types from each other. In this embodiment, the first transistor 100a is an N-channel junction type field-effect transistor and the second transistor 100b is a P-channel junction type field-effect transistor. The drain electrode (D) of the first field-effect transistor 100a is connected to a DC power source $V_{DD}$ and the source electrode (S) thereof is connected through a resistor $R_4$ to the source electrode of the second field-effect transistor 100b, the drain electrode of which is grounded. A series circuit of capacitors 104a and 104b is connected in parallel with the resistor $R_4$. The respective gate electrodes (G) of the first and second field-effect transistors 100a and 100b are connected to each other and the connecting point thereof is connected to one output terminal $t_{10a}$ of a signal source 102 (a microphone in this example), while the other output terminal $t_{10b}$ of the signal source 102 is grounded. A primary winding 103a of a matching transformer 103 is connected by one lead to the connecting mid-point of the capacitors 104a and 104b and by its other lead to the circuit ground. The secondary winding 103b of the matching transformer 103 is connected by its separate leads to a pair of output terminals $t_{12a}$ and $t_{12b}$, respectively. Reference character $t_{12c}$ denotes another output terminal which is grounded. It should be noted that no gate biasing resistor is provided in the preamplifier PA10.

Operation of the preamplifier PA10 will now be described with reference to FIGS. 5 and 6. In FIG. 5, the reference character $V_{DD}$ designates a power source voltage, $V_{DS1}$ a voltage between the drain and source of the first field-effect transistor 100a, $V_{SD2}$ a voltage between the source and drain of the second field-effect transistor 100b, $V_{GS}$ a voltage between the common gate and source of the first and second field-effect transistors 100a and 100b and $V_G$ a gate voltage, respectively.

Figure 6:
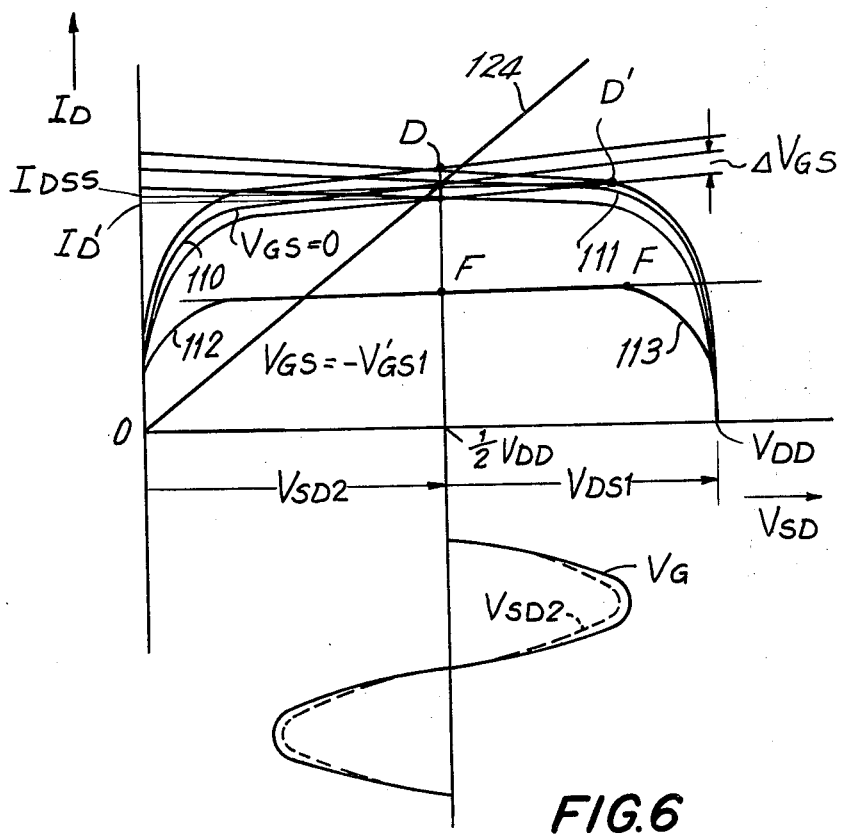
FIG. 6 is the characteristic curve used for explaining the circuit shown in FIG. 4, and FIGS. 7 to 10, inclusive, are circuit diagrams showing second, third, fourth and fifth embodiments of the invention, respectively.

FIG. 6 is a diagram showing the operating characteristic curves $V_{DS1}$–$I_D$ and $V_{SD2}$–$I_D$ when the value $V_{GS}$ of the preamplifier of FIG. 5 is taken as parameter. In FIG. 6, reference numerals 110 and 111 indicate operating characteristic curves $V_{SD2}$–$I_D$ and $V_{DS1}$–$I_D$, respectively, at the condition of $V_{GS} = 0$, and a point D expresses an intersection of these curves 110 and 111. The point D is a position where the condition $V_{SD2} = V_G = (V_{DD}/2)$ is satisfied if the field-effect transistors 100a and 100b are in a completely complementary relation. The parts of the $V_{SD2}$–$I_D$ and $V_{DS1}$–$I_D$ characteristic curves 110 and 111 in the neighborhood of the operating point D show constant current characteristics and are almost flat. Accordingly, when an AC signal $V_G$ applied to the gates increases in a positive direction, the voltage $V_{GS}$ of the field-effect transistor 100b decreases while the voltage $V_{GS}$ of the field-effect transistor 100a increases, thereby moving the operating point D to a point D'. That is, if the voltage $V_{GS}$ changes to $V_{GS}$ , namely $V_{GS} + \Delta V_{GS}$ ($\Delta V_{GS} > 0$) during the half cycle by the output of the microphone 102, the operating point D of the field-effect transistors 100a and 100b moves to the point D'. However, the output characteristics of the field-effect transistors 100a and 100b are almost flat within the areas of $V_{DS1} > V_P$ and $V_{SD2} > V_P$ where $V_P$ indicates a pinch-off voltage of the field-effect transistors 100a and 100b. Therefore, variation $\Delta V_{SD2}$ of the voltage $V_{SD2}$ is relatively large as compared with the variation $\Delta V_{GS}$ of the voltage $V_{GS}$, with the result that the following relation is established:

$$\Delta V_{SD2} >> \Delta V_{GS}$$

In other words, even if the voltage $V_G$ is varied from $V_{DD}/2$ by $\Delta V_G$, the $V_{GS}$ is only slightly changed and the voltage $V_{SD2}$ can easily follow the variation of $V_G$. Accordingly, the variation $\Delta V_{SD2}$ of the voltage $V_{SD2}$ is nearly equal to the output $\Delta V_G$ of the microphone 102 ($\Delta V_{SD2} \approx \Delta V_G$) and as a result, the output of the microphone 102 can be derived from the source electrodes of the field-effect transistors 100a and 100b without distortion.

In this case, drain current $I_D'$ at the intersection D' is nearly equivalent to $I_{DSS}$ since the field-effect transistors 100a and 100b are in a complementary relation and are utilized within the range of the constant current characteristics and hence the output voltage $V_{SD2}$ can be obtained substantially in proportion to $V_G$. As a result, it is possible to make the distortion factor much smaller than that of the prior art source follower type field-effect transistor amplifier as shown in FIG. 1 and to enlarge its dynamic range in proportion to the reduction of the distortion factor.

In addition, since the variation of operating current $I_D$ according to the variation of amplitude of the AC signal $V_G$ is quite small the variation of power source voltage according to power source impedance can be limited to nearly zero with the result that the operating point becomes stable and the resulting distortion can be suppressed.

In the case when the first and second field-effect transistors 100a and 100b are connected with the resistor $R_4$ between the respective source electrodes thereof as shown in FIG. 4, the voltage $V_{GS}$ between the gate and the source changes to $-V'_{GS1}$ ($V'_{GS1} < 0$). In this case, the characteristic curves $V_{SD2}-I_D$ and $V_{DS1}-I_D$ becomes as shown by curves 112 and 113, respectively, of FIG. 6, in which reference character F express their intersection, that is, the operating point. In this case, each of the first and second field-effect transistors 100a and 100b is reversely biased between its gate and source and hence even if an input signal has a large amplitude, the gate and source electrodes are not forwardly biased therebetween. Since the first and second field-effect transistors 100a and 100b are biased from each other between each gate and source thereof, these first and second field-effect transistors 100a and 100b may not be in a complete complementary relation, that is, they may be slightly different in characteristic from each other. Consequently, the first and second field-effect transistors 100a and 100b are adapted to gate-bias to each other and hence the operating point is stable in spite of the absence of a gate biasing resistor.

Further, in the $V_{SD}-I_D$ characteristic curves 112 and 113 of the field-effect transistors 100a and 100b, the constant current range becomes flatter as the current $I_D$ decreases, so that the variation of operating current $I_D$ according to the amplitude of AC signal is made less and the resulting distortion is decreased more than the case of $V_{GS} = 0$.

According to the invention as described above, a preamplifier is provided for use with an electrostatic type mechanical-electrical transducer comprising first and second field-effect transistors which are of different conductive types from each other, the gate electrodes thereof being connected to each other and further connected to the electrostatic type mechanical electrical transducer, the source electrodes thereof being connected to each other and further connected to an output terminal, and the respective drain electrodes being connected therebetween with a DC power source, so that the gate electrodes are interconnected without a biasing resistor with the result that its dynamic range can be made wide, tone deterioration is not caused, the operating point is stabilized and the transient response characteristic is improved.

Thus the preamplifier PA10 described in reference to FIG. 4 produces a microphone output of high quality. It is nevertheless desirable for the preamplifier PA10 to satisfy the following conditions:

A. Since the microphone 102 is high in impedance, noises in the field-effect transistors 100a and 100b are mostly caused by equivalent noise currents respectively produced between the gate and source thereof. In this case, the equivalent noise currents are proportional to gate leak currents $I_G$ of the field-effect transistors 100a and 100b, so that the gate leak currents $I_G$ are required to be as small as possible for the field-effect transistors 100a and 100b.

B. In the preamplifier PA10 shown in FIG. 4, the AC load line is expressed by, for example, a straight line 124 in FIG. 6, but when the current $I_{DSS}$ of the field-effect transistors 100a and 100b is small, its AC load line moves parallel in the right direction with respect to the line 124. Accordingly, the dynamic range for the same load in this case becomes narrow. As a result, the current $I_{DSS}$ of the field-effect transistors 100a and 100b is preferred to be larger with respect to the same load.

C. In the foregoing, when the mutual conductance gm of the field-effect transistors 100a and 100b is large, the condition $\Delta V_{SD2} >> \Delta V_{GS}$ is established.

D. In order to broaden the dynamic range, the power source voltage $V_{DD}$ should be increased and to this end the breakdown voltage of the field-effect transistors 100a and 100b is required to be high.

In these cases, however, assuming that the channel length of the field-effect transistors 100a and 100b is L (normally 2 to 10 microns), the channel width thereof is W (0.7 to 2 mm) and the channel resistivity thereof is $\rho$ (0.5 to 5 ohm-cm.), the following relationships are seen, in general:

a) $I_G \alpha$  $W: I_G \alpha$  $L^-$  (where $\alpha$ is an experimentarily determined constant)
b) $I_{DSS} \alpha$  $(W/L)(1/\rho)$
c) gm $\alpha$  $(W/L)(1/\rho)$
d) Breakdown voltage of the transistor is approximately proportional to 0.6 square of $\rho$.

Therefore, it is sometimes difficult to satisfy all of the above conditions (A) to (D). For example, if $\rho$ is made small to make $I_{DSS}$ large, the breakdown voltage becomes low which thereby makes the dynamic range narrow. Further, if the gate leak current $I_G$ is made small to decrease the equivalent noise, $I_{DSS}$ and gm become small.

Further, if a load of small value is connected to the preamplifier PA10, its AC load line is similarly moved rightwards from the line 124 of FIG. 6 and hence the dynamic range becomes narrow. But, this defect is corrected by a circuit construction to be described hereinafter. In the following figures, the same components as those described above will be given the same reference numbers.

Figure 7:
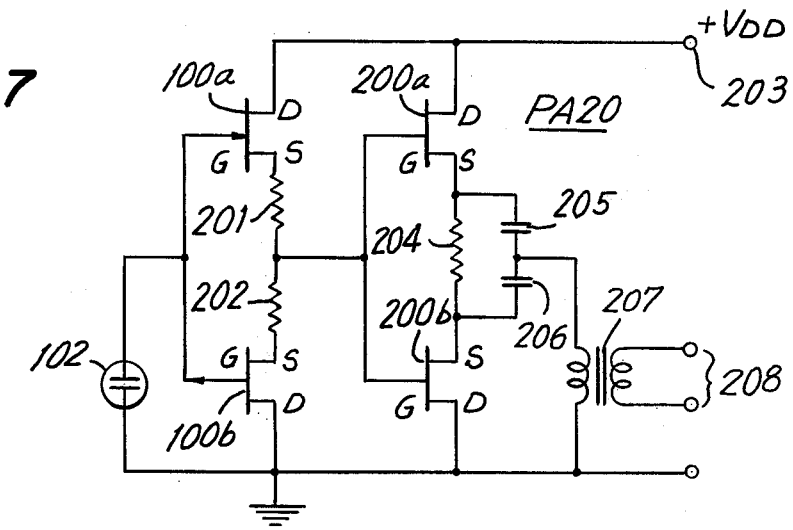

FIG. 7 shows a preamplifier PA20 in accordance with a second embodiment of the invention. Field-effect transistors 100a and 100b are interconnected in a complementary source follower configuration while an N-type field-effect transistor 200a and a P-type field-effect transistor 200b are similarly interconnected in complementary source follower configuration, the two pairs of these field-effect transistors 100a, 100b and 200a, 200b being further connected in cascade.

Each gate electrode of the complementarily connected field-effect transistors 100a and 100b is grounded through a microphone 102 and the respective source electrodes thereof are interconnected through a series circuit of resistors 201 and 202. The drain electrode of the field-effect transistor 100a is connected to a power source terminal 203 and the drain electrode of the field-effect transistor 100b is grounded. The connecting point of the resistors 201 and 202 is connected to each gate electrode of the complementarily connected field-effect transistors 200a and 200b and the respective source electrodes thereof are interconnected through a resistor 204. The drain electrode of the field-effect transistor 200a is connected to the power source terminal 203 while the drain electrode of the field-effect transistor 200b is grounded. The respective source electrodes of the field-effect transistors 200a and 200b are further connected therebetween with a series circuit of capacitors 205 and 206, the connecting point of which is connected through the primary winding of a transformer 207 to the circuit ground. The secondary winding of the transformer 207 is connected to an output circuit 208.

In this case the field-effect transistors 100a and 100b are selected to be small in $I_G$ in order to reduce noise and therefore the current $I_{DSS}$ thereof becomes small. Since the field-effect transistors 200a and 200b are selected to be large in $I_G$, the current $I_{DSS}$ thereof becomes large. Further, the field-effect transistors 100a and 100b operate as a source follower configuration, so that the output impedance is low. Accordingly, the input signal source impedance with respect to the field-effect transistors 200a and 200b is low, so that even if the current $I_{DSS}$ of the field-effect transistors 200a and 200b is large, noise caused thereby is small and hence the whole circuit is also low in noise.

Since the load of the field-effect transistors 100a and 100b is the field-effect transistors 200a and 200b, which are in the source follower configuration, the load impedance is high and hence even though the current $I_{DSS}$ of the field-effect transistors 100a and 100b is small, the dynamic range of the field-effect transistors 200a and 200b is wide. The current $I_{DSS}$ of the field-effect transistors 200a and 200b is large and hence even though the load impedance is low, the dynamic range thereof is wide. As a result, the dynamic range of the whole circuit is also wide. Further, the drain current of the field-effect transistors 100a and 100b is also almost not changed in response to changes in the input signal and hence the power source voltage $V_{DD}$ is not varied, with the result that tone deterioration is not thereby generated.

Figure 8:
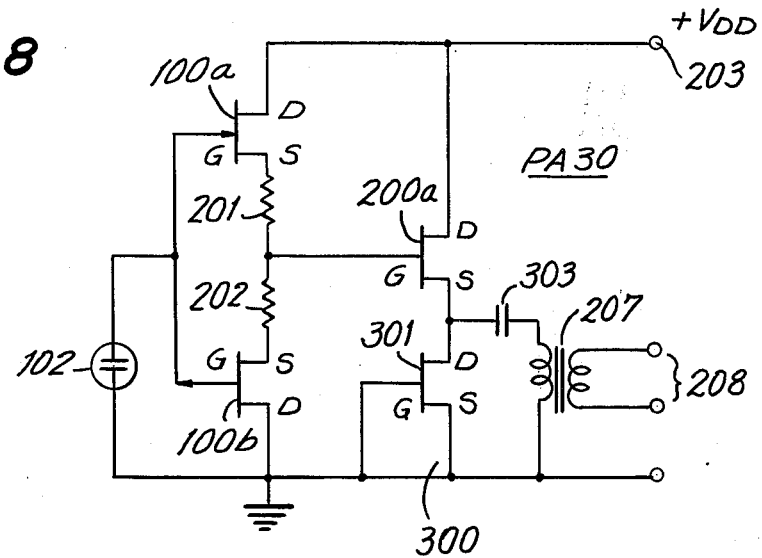
Figure 9:
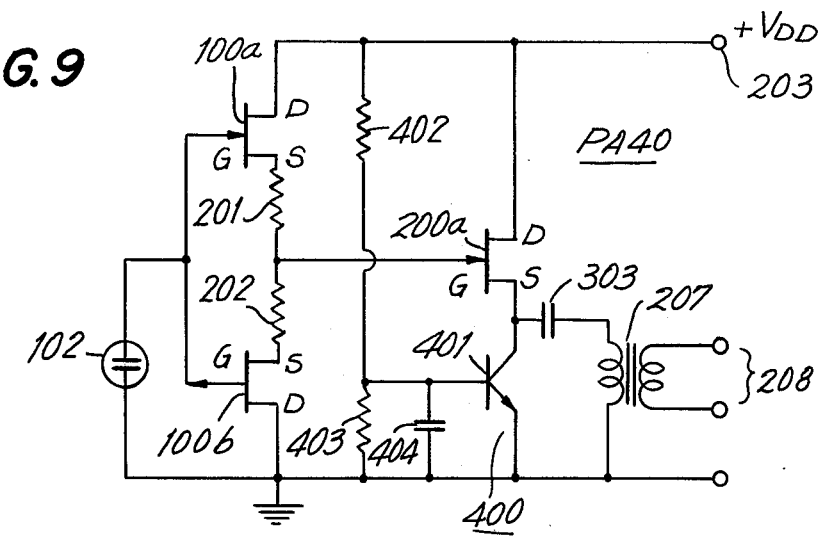

In preamplifiers PA30 and PA40 shown in FIGS. 8 and 9, which are third and fourth embodiments of the invention, respectively, constant current circuits 300 and 400 are respectively connected in place of the transistor 200b in the embodiment of FIG. 7. That is, in the embodiment of FIG. 8, a constant current source 300 in the form of an N-channel junction type field-effect transistor 301 is provided, having its gate and source electrodes grounded and its drain electrodes connected to the source electrode of the field-effect transistor 200a. The constant current circuit 300 serves as a source load for the field-effect transistor 200a. Accordingly, the field-effect transistor 200a becomes of the source follower type. The output of the field-effect transistor 200a is supplied through a capacitor 303 to the grounded primary winding of the transformer 207.

FIG. 9 shows an example in which the constant current circuit 400 is constructed of a bipolar NPN transistor 401. In this case, the base bias of the transistor 401 is supplied from a connection mid-point of a pair of resistors 402 and 403 connected in series between the power source and the circuit ground. The emitter of the transistor 401 is connected directly to the circuit ground and is also connected to the base of transistor 401 through a capacitor 404. The collector of the transistor 401 is connected to the source electrode of the transistor 200a and through the capacitor 303 to the grounded primary winding of the output transformer 207.

In these examples, too, the field-effect transistors 100a and 100b are made small in $I_{DSS}$ and the field-effect transistor 200a is made large in $I_{DSS}$. Therefore, in a manner similar to that of the embodiment of FIG. 7, the noise is small and the dynamic range becomes wide. Further, even though only a single field-effect transistor 200a is employed, its DC load is the constant current circuit, so that the drain current of the field-effect transistor 200a is nearly constant with respect to the input signal. Accordingly, if an output transformer having a proper winding ratio is employed within the range of practical load impedance, tone deterioration caused by the variation of the power source voltage $V_{DD}$ is not present. In the preamplifier PA30 of FIG. 8, its distortion factor is less than 1 percent for a load of 350 ohms in the range of an input voltage of 10 $V_{rms}$ and less, and a signal to noise ratio of about 53 dB can be obtained under the condition that the microphone element capacity is 50 PF at an input signal voltage of 1 mV.

Figure 10:
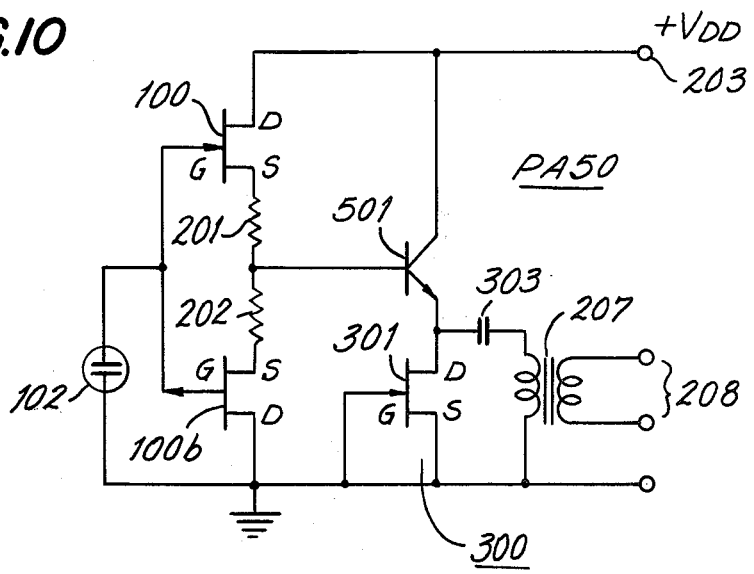

FIG. 10 shows a preamplifier PA50 in accordance with a fifth embodiment of the invention in which the source electrode output of the field-effect transistors 100a and 100b is applied to the base of a bipolar NPN transistor 501 connected in an emitter follower configuration and having the constant current circuit 300 (of FIG. 8) as its DC load. The current $I_{DSS}$ of the field-effect transistors 100a and 100b is made small and the collector current of the bipolar transistor 501 is made large, with the same result as described above.

In the above described examples, a transducer having a high output impedance such as an electret condenser cartridge may be used in place of the microphone 102. Further, each field-effect transistor may be of the MOS-type.

While in the above described embodiments transistors of a certain conductivity type have been described, it should be apparent to those skilled in the art that in other embodiments transistors of the opposite conductivity type may be utilized with appropriate changes in voltage biasing or lead connections.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. An amplifying circuit for use with a signal source comprising first and second field-effect transistors which are of different conductive types, and each of which has gate, drain and source electrodes, the gate electrodes of the first and second field-effect transistors being connected to each other, a pair of resistors in series connecting the source electrodes of the first and second field-effect transistors to each other in a source follower configuration so as to present a low output impedance, means connecting the signal source between the interconnected gate electrodes of the first and second field-effect transistors and the drain electrode of the second field-effect transistor, said first and second field effect being selected to have small values of drain-source current in the absence of any gate-source bias, a third transistor which has control, output and common electrodes, means connecting said control electrode to said resistors at a connection point between the latter, a constant current source connected to said output electrode, means for supplying power to said drain electrode of said first field-effect transistor and to said common electrode of the third transistor, an output circuit connected between said output electrode of the third transistor and said drain electrode of the second field-effect transistor, said third transistor and said constant current source cooperating to provide a high load impedance for said first and second field effect transistors, and said third transistor being selected to have a relatively high common to output electrode current in the absence of any control to output electrode bias.

2. An amplifying circuit as recited in claim 1 wherein the signal source is a mechanical-electrical transducer of the electrostatic type.

3. An amplifying circuit as recited in claim 1 wherein the output circuit comprises a series connection of a capacitor and a transformer.

4. An amplifying circuit as recited in claim 1; wherein the third transistor is a field-effect transistor having gate, drain and source electrodes constituting said control, common and output electrodes, respectively, and the constant current source includes a fourth field-effect transistor having gate drain and source electrodes, means connecting the source electrode of the third field-effect transistor and the drain electrode of the fourth field-effect transistor to each other, and means connecting the gate and source electrodes of the fourth field-effect transistor to each other and to the drain electrode of the second field-effect transistor.

5. An amplifying circuit as recited in claim 1; wherein the third transistor is a field-effect transistor having gate, drain and source electrodes constituting said control, common and output electrodes, respectively; and the constant current source includes a bipolar transistor having base, collector and emitter electrodes, a bias voltage source connected to the base electrode of the bipolar transistor, means connecting the source electrode of the third field-effect transistor to one of the emitter and collector electrodes of the bipolar transistor and to the output circuit, and means connecting the other of the emitter and collector electrodes of the bipolar transistor to the drain electrode of the second field effect transistor.

6. An amplifying circuit as recited in claim 1; wherein the third transistor is a bipolar transistor having base, collector and emitter electrodes which constitute said control, common and output electrodes, respectively; and the constant current source includes a fourth transistor which is a field-effect transistor having gate, drain and source electrodes, means connecting the emitter electrode of the bipolar third transistor and the drain electrode of the fourth field effect transistor to each other and to the output circuit, and means connecting the gate and source electrodes of the fourth field-effect transistor to each other and to the drain electrode of the second field-effect transistor.

7. An amplifying circuit as recited in claim 1; wherein said third transistor is a field-effect transistor having gate, drain and source electrodes constituting said control, common and output electrodes, respectively, and said third field-effect transistor has a large value of drain-source current in the absence of any gate-source bias applied thereto.

8. An amplifying circuit as recited in claim 1; wherein said third transistor is a bipolar transistor having base, collector and emitter electrodes constituting said control, common and output electrodes, and said third transistor has a large collector current.

* * * * *